(12) United States Patent
Barr

(10) Patent No.: US 6,503,336 B1
(45) Date of Patent: Jan. 7, 2003

(54) TECHNIQUES FOR MODIFYING A CIRCUIT BOARD USING A FLOW THROUGH NOZZLE

(75) Inventor: Gordon O. Barr, Somerville, MA (US)

(73) Assignee: EMC Corporation, Hopkinton, MA (US)

(*) Notice: Subject to any disclaimer, the term of this patent is extended or adjusted under 35 U.S.C. 154(b) by 136 days.

(21) Appl. No.: 09/813,697

(22) Filed: Mar. 21, 2001

(51) Int. Cl.$^7$ ................................................ B08B 3/00
(52) U.S. Cl. .................. 134/34; 134/35; 134/37; 134/199; 15/302; 15/345; 239/79
(58) Field of Search ......................... 134/34, 35, 36, 134/37, 21, 199; 15/345, 302; 239/79, 135, 288

(56) References Cited

U.S. PATENT DOCUMENTS

| | | | |
|---|---|---|---|
| 4,798,008 A | * | 1/1989 | Belanger et al. ............... 15/302 |
| 6,350,319 B1 | * | 2/2002 | Curtis et al. ................. 118/715 |
| 6,357,457 B1 | * | 3/2002 | Taniyama et al. ............ 134/148 |

* cited by examiner

*Primary Examiner*—Randy Gulakowski
*Assistant Examiner*—Saeed Chaudhry
(74) *Attorney, Agent, or Firm*—Chapin & Huang, L.L.C.; David E. Huang, Esq.

(57) ABSTRACT

A nozzle applies fluid (e.g., heated gas) to a solder region of a circuit board component having a set of fluid-delivery edges and a set of fluid-escape edges. The nozzle includes a top member to connect with a fluid source, and a set of fluid-delivery side members coupled to the top member. Each fluid-delivery side member extends from the top member and around a respective fluid-delivery edge of the circuit board component when the circuit board component engages with the nozzle. Each fluid-delivery side member defines (i) at least a portion of a fluid-delivery channel that extends from a vicinity adjacent the top member toward the solder region of the circuit board component when the circuit board component engages with the nozzle, and (ii) a barrier that substantially prevents fluid from escaping from the solder region along the respective fluid-delivery edge for that fluid-delivery side member.

20 Claims, 9 Drawing Sheets

TECHNIQUES FOR MODIFYING A CIRCUIT BOARD USING A FLOW THROUGH NOZZLE

BACKGROUND OF THE INVENTION

Some circuit board manufacturers occasionally have the need to remove soldered lead frame integrated circuit (IC) components from circuit boards. For example, a circuit board manufacturer may have inadvertently manufactured a batch of circuit boards with the wrong, faulty or unreliable (e.g., "out of spec") lead frame components. Rather than scrap the otherwise correctly manufactured circuit boards, the manufacturer unsolders the original lead frame components from the circuit boards, cleans the circuit boards, and subsequently solders new lead frame components to the circuit boards.

A typical lead frame component is rectangular in shape and has sets of metallic leads that extend on two sides (i.e., opposite sides), or alternatively on all four sides. After such a component has been soldered to a circuit board, a circuit board manufacturer can unsolder that component from the circuit board using a manifold assembly that blows heated gas (e.g., heated nitrogen gas) therethrough. To this end, a user (e.g., a trained technician employed by the circuit board manufacturer) typically places the circuit board on a flat heater so that the side of the circuit board having the lead frame component faces up. The flat heater raises the overall temperature of the circuit board (e.g., to a temperature of 100 degrees Celsius). The user then lowers the manifold assembly over (i.e., on top of) the lead frame component. The manifold assembly typically includes a set of metallic exhaust elements which extend from a central location down over the metallic leads of the lead frame component. Typically, the manifold assembly further includes a vacuum element which is disposed between the exhaust elements and which extends from the central location down on top of the package of the lead frame component. After the user lowers the manifold assembly over the lead frame component, the user activates (i) a vacuum source that sucks air through the vacuum element, and (ii) a heated gas source that blows heated gas through the exhaust elements. The exhaust elements of the manifold assembly direct the heated gas in a downward direction toward the circuit board surface and over the metallic leads of the component. Eventually, the heated gas melts the solder holding the metallic leads of the component thus freeing the component from the circuit board. The vacuum element takes hold of the lead frame component, and the user then lifts manifold assembly and the component (which is now attached thereto) away from the circuit board thus completing removal of the component.

In subsequent steps, the manufacturer cleans the circuit board and prepares the circuit board to receive a new lead frame component. To this end, the user typically removes (e.g., melts and vacuums) any remaining solder from the exposed mounting location of the circuit board (i.e., the circuit board location on which the original lead frame component resided), and washes the mounting location using a special solution that removes oxidized metal and any remaining contaminants.

Next, the user installs the new lead frame component on the mounting location of the original lead frame component. To this end, the user distributes, or "prints", solder paste over the mounting location using a stencil. Next, the user positions the new lead frame component over the mounting location using a workstation having a microscope and a set of gears that enable the user to locate the new lead frame component over the mounting location with high precision. The user then applies heat to solder the new lead frame component in place. In some situations, the user can use the same flat heater and manifold assembly which were used to remove the original lead frame component (e.g., the flat heater and the manifold assembly can be integrated parts of the workstation). In other situations, the user employs other devices to solder the new lead frame component in place (e.g., automated equipment).

Some circuit board manufacturers can remove and install ball grid array (BGA) components using a metallic nozzle that blows heated gas over the BGA components in order to heat the BGA components in a top down manner. That is, the nozzle blows heated gas onto the top of the BGA component toward the surface of the circuit board. Accordingly, the temperature of the top of the BGA component gradually rises ahead of the temperature at the bottom of the BGA component, and eventually the heat permeates to the soldering region underneath the BGA component. Accordingly, the temperature of the soldering region of the BGA component (i.e., an array of solder balls) eventually exceeds the solder melting temperature and the BGA component becomes free. A central vacuum element in the middle of the nozzle grabs the BGA component in a manner similar to that for the lead frame devices so that the BGA component can be removed from the circuit board by lifting the nozzle away from the circuit board.

After the BGA component is removed, the mounting location of the circuit board can be cleaned of old solder and printed with new solder for installation of a new BGA component. Then, the user can install the new BGA component onto the mounting location. In some situations, the user can use a workstation that employs the same metallic nozzle which was used to remove the BGA component. In other situations, the user can employ automated equipment to install the new BGA component. A typical amount of time for the entire process of removing an old BGA component, cleaning and prepping the mounting location, and installing a new BGA component is approximately one hour.

SUMMARY OF THE INVENTION

Unfortunately, there are deficiencies to above-described conventional approaches to removing circuit board components. For example, it takes a significant amount of time to remove a BGA component from a circuit board and install a new one (e.g., one hour). In situations that require removal and replacement of such a component from many circuit boards (e.g., mass production situations), the component removal/installation station that performs the process of removing the old circuit board components and installing new circuit board components in their place can easily become a bottleneck.

Additionally, the process of installing a new BGA component using the above-described top down heating approach can provide significant stresses on the component and the mounting location of the circuit board. In particular, the uneven heating of the component and the mounting location for an extended period of time (i.e., raising the temperature of the top of the component ahead of the component underside and the mounting location of the circuit board) provides substantial thermal stresses that raise reliability concerns. That is, severe distortions (e.g., twisting and bending) in the component and in the circuit board can damage any of the interconnects between the silicon chip and the internal conductors of the circuit board, the circuit board laminate and/or the neighboring interfacial vias (e.g., fracturing a wire bond).

Furthermore, the above-described conventional manifold assembly, which has the exhaust elements and the vacuum element, is not well-suited for removing or installing a circuit board component having a solder region hidden between the component itself and the circuit board since the manifold assembly is typically lowered on top of an component, the exhaust elements of the manifold assembly typically blow heated gas toward in a downward direction toward the circuit board surface. The heated gas typically does not blow underneath the IC component but simply down on top of the metallic leads.

In contrast to the above-described conventional approaches to removing and installing circuit board components, the invention is directed to techniques for modifying a circuit board (e.g., removing and/or installing a circuit board component) by providing fluid (e.g., heat gas) between the circuit board component and the circuit board. As such, the temperature of the circuit board and the component can be controlled in a more even manner (e.g., the temperature on the top and the bottom of the component can be raised simultaneously) relative to the above-described conventional top down manner. Accordingly, for a component having a soldering region between the component and the circuit board (e.g., a BGA component), the thermal stress placed on the component and the circuit board mounting location can be minimized. Additionally, the temperature of the soldering region between the component and the circuit board can be raised more quickly than in the conventional approaches thus shortening the time required to remove an old component and install a new one to improve the manufacturing process throughput (e.g., to reduce the total time required to completely rework a circuit board).

One arrangement of the invention is directed to a nozzle for applying fluid (e.g., a heated gas) to a solder region of a circuit board component. The circuit board component has a set of fluid-delivery edges and a set of fluid-escape edges. The nozzle includes a top member to connect with a fluid source, and a set of fluid-delivery side members coupled to the top member. Each fluid-delivery side member extends from the top member and around a respective fluid-delivery edge of the circuit board component when the circuit board component engages with the nozzle. Each fluid-delivery side member defines (i) at least a portion of a fluid-delivery channel that extends from a vicinity adjacent the top member toward the solder region of the circuit board component when the circuit board component engages with the nozzle, and (ii) a barrier that substantially prevents fluid from escaping from the solder region of the circuit board component along the respective fluid-delivery edge for that fluid-delivery side member. Accordingly, flow can be forced underneath the component in order to melt solder at the soldering region in order to quickly unsolder the component from the circuit board or solder the component to the circuit board. This arrangement is simpler, requires less time, and does not compromise reliability as compared to the earlier-described conventional top down heating approach.

In one arrangement, the nozzle further includes a set of fluid-escape side members coupled to the top member. Each fluid-escape side member extends from the top member and around a respective fluid-escape edge of the circuit board component when the circuit board component engages with the nozzle. Each fluid-escape side member defines at least a portion of a fluid-escape channel to enable gas to escape from the solder region of the circuit board component when the circuit board component engages with the nozzle and when the set of fluid-delivery side members contact the circuit board. Accordingly, fluid (e.g., heated gas) escapes through the fluid-escape channels thus providing a path for constant fluid flow for enhanced heat delivery to the solder region of the circuit board component.

In one arrangement, the set of fluid-escape side members couple to the set of fluid-delivery side members. In this arrangement, the top member, the set of fluid-delivery side members and the set of fluid-escape side members form a cavity over a side of the circuit board component that is opposite the solder region (i.e., over the top of the component) when the circuit board component engages with the nozzle. As such, fluid flowing through the cavity can quickly bring the side of the circuit board component that is opposite the solder region to the same temperature as the solder region thus avoiding thermally stressing the circuit board component with substantially uneven temperatures.

In one arrangement, the set of fluid-delivery side members includes exactly two fluid-delivery side members, and wherein the set of fluid-escape side members includes exactly two fluid-escape side members. In this arrangement, the two fluid-delivery side members and the two fluid-escape side members can form a rectangle. Preferably, the two fluid-delivery side members are disposed on opposite sides of the rectangle, and the two fluid-escape side members are disposed on other opposite sides of the rectangle.

In one arrangement, each fluid-escape side member includes an interference portion which defines an interference surface that prevents the circuit board component from contacting the top member when the circuit board component engages with the nozzle. In this arrangement, the interference portion of each fluid-escape side member further can define at least one vacuum channel or hole through the interference surface to hold the circuit board component in response to a vacuum from a vacuum source. Accordingly, the nozzle can hold the circuit board component along its periphery and thus avoiding the need for a central vacuum element.

The features of the invention, as described above, may be employed in manufacturing systems, devices and methods such as those of EMC Corporation of Hopkinton, Mass.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for modifying a circuit board (e.g., removing an old circuit board component from the circuit board and/or installing a new circuit board component onto the circuit board) using a nozzle that is capable of providing fluid (e.g., heated gas) between a particular circuit board component and the circuit board. As such, heat can be applied in a more even manner (e.g., simultaneously above and under the component) than a conventional top down manner. Accordingly, for a component having a soldering region between the component and the circuit board (e.g., a BGA component), there can be less thermal stress placed on the component and the circuit board mounting location when the fluid is simultaneously delivered to the top of the component and the soldering region between the component and the circuit board. Additionally, the temperature of the soldering region rises more quickly thus shortening the time required to remove an old component and/or install a new one.

Figure 1:
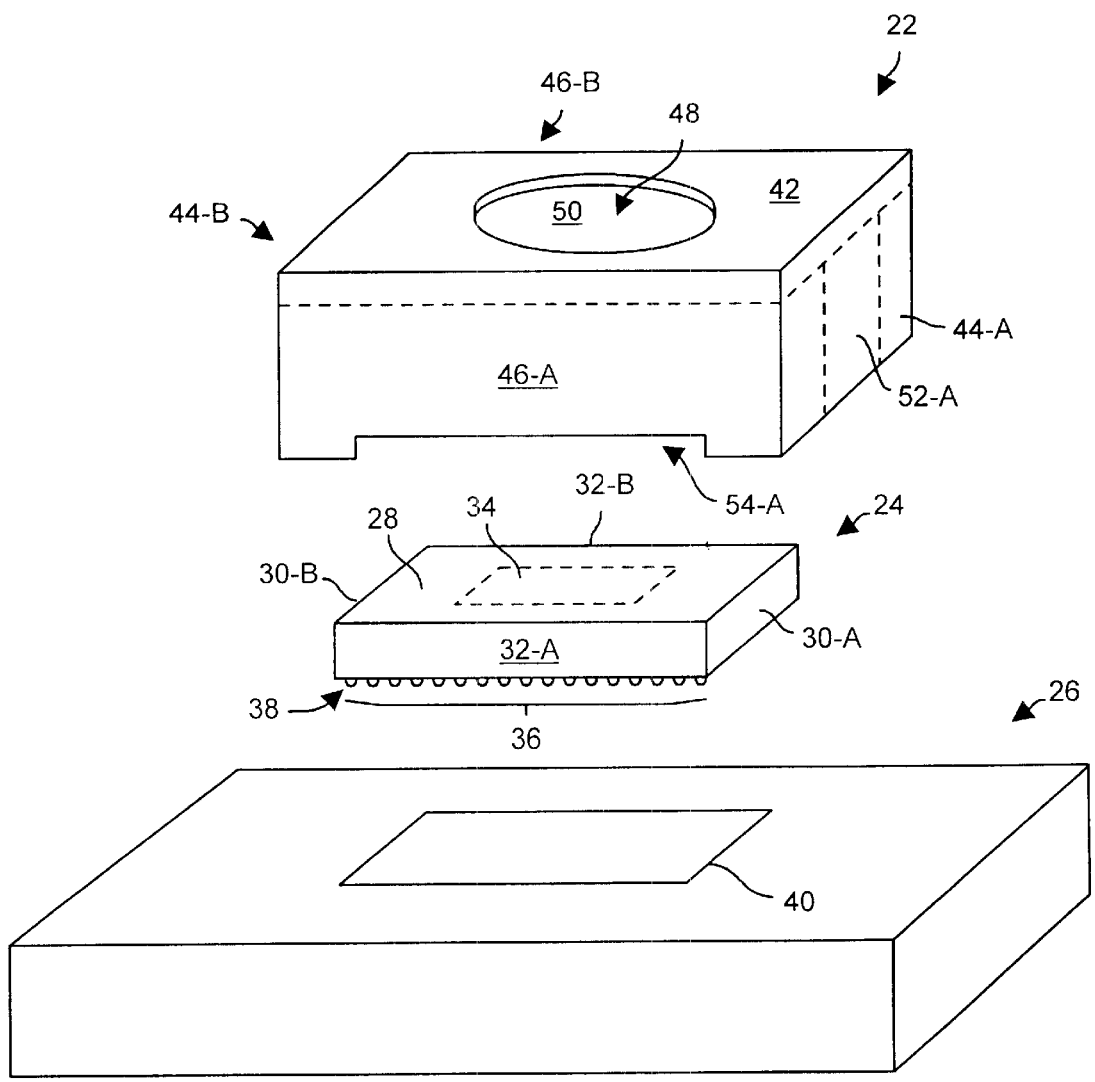
FIG. 1 is a perspective view of a nozzle, which is positioned over a circuit board component and a circuit board, that is suitable for use by the invention.

FIG. 1 shows a perspective view 20 of a flow through nozzle 22, a circuit board component 24 and a circuit board 26, which are suitable for use by the invention. The circuit board component 24 includes a component package 28 having fluid-delivery edges 30-A, 30-B and fluid-escape edges 32-A, 32-B. The circuit board component 24 can be a conventional component having edges which are merely labeled as fluid-delivery edges 30, and fluid-escape edges 32 due to their correspondence with particular portions of the nozzle 22. The circuit board component 24 further includes an internal portion 34 (e.g., a silicon chip) and an external solder region 3. By way of example only, the circuit board component 24 is a BGA module, and the solder region 36 includes an array of solder balls 38. The circuit board component 24 solders to a mounting location 40 (an array of pads corresponding to the array of solder balls 38) of the circuit board 26.

The nozzle 22 can be used to direct fluid (e.g., heated nitrogen gas) underneath the component 24 to solder the component 24 to the circuit board 26, or unsolder the component 24 from the circuit board 26. The nozzle 22 includes a top member 42, fluid-delivery side members 44-A, 44-B (collectively, a set of fluid-delivery side members 44) and fluid-escape side members 44-A, 44-B (collectively, a set of fluid-escape side members 46). The top member 42 defines an input channel 48 that leads to an interior cavity 50 of the nozzle 22 and that receives fluid (e.g., heated gas) from a fluid source. In one arrangement, the input channel 48 is appropriately sized to fit an end of a heat gun so that the nozzle 22 can be manually moved around by a user holding the heat gun, or by a workstation (e.g., operated by a user looking through a microscope) that maneuvers the heat gun using an assembly of knobs and gears.

Each fluid-delivery side member 44 extends from the top member 42 and around a respective fluid-delivery edge 30 of the circuit board component 24. When the circuit board component 24 engages with the nozzle 22, each fluid-delivery side member 44 defines a portion of a fluid-delivery channel 52 that extends from a vicinity adjacent the top member 42 (e.g., the interior cavity 50) toward the solder region 36 of the circuit board component 24. When the set of fluid-delivery side members 44 contacts the circuit board 26, each fluid-delivery side member 44 further defines a barrier that substantially prevents fluid from escaping from the solder region 36 through that fluid-delivery side member 44.

When the circuit board component 24 engages with the nozzle 22 and when the set of fluid-delivery side members 44 contacts circuit board 26, each fluid-escape side member 46 defines a portion of a fluid-escape channel 54 that enables fluid to escape from the solder region 36 of the circuit board component 24. That is, the barriers formed by the set of fluid-delivery side members 44 forces the fluid to flow underneath the component 24 and around the solder region 36 (e.g., around the solder balls 38) thus bringing the solder region to the same temperature as the top of the component 24 (e.g., a high enough temperature to melt solder in the solder region 36 in order to remove or install the component 24. Further details of the invention will now be provided with reference to FIG. 2.

Figure 2:
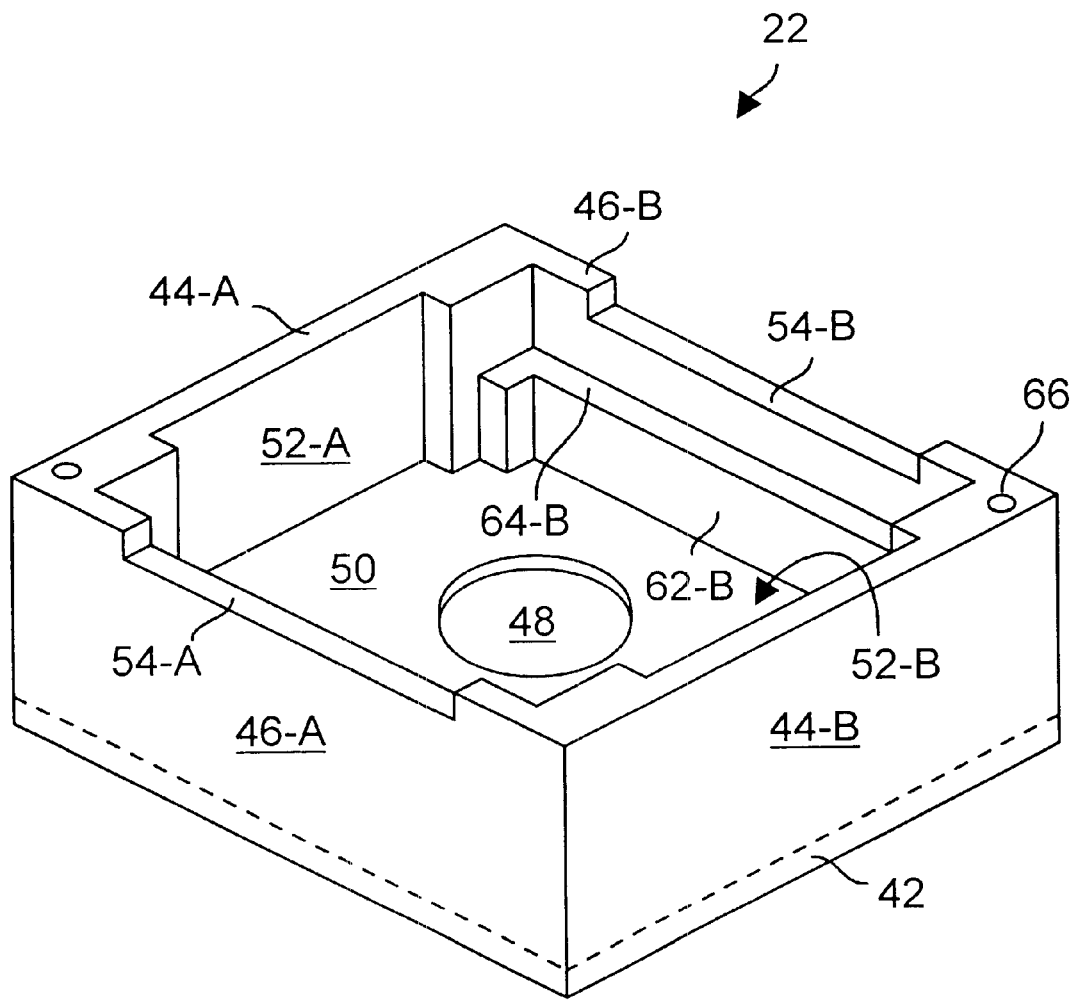
FIG. 2 is a perspective view of the nozzle of FIG. 1 showing particular details of an underside of the nozzle.

FIG. 2 shows a perspective view 60 of the nozzle 22 of FIG. 1 illustrating particular details of the underside of the nozzle 22. As shown, each fluid-escape side member 46 includes an interference portion 62 (e.g., the interference portion 62-B of the fluid-escape side member 46-B) which defines an interference surface 64 (e.g., the interference surface 64-B) that prevents the circuit board component 24, when engaged with the nozzle 22, from inadvertently contacting the top member 42. Accordingly, the cavity 50 formed by the nozzle 22 and the circuit board component 24 remains intact and operates as a plenum for pressurized gas (e.g., heated nitrogen gas) entering through the input channel 48 and flowing through the solder region 36.

In one arrangement, the side members 44, 46 of the nozzle 22 further define alignment holes 66 which enable the nozzle 22 to physically align over the mounting location 40 of the circuit board 26 (see FIG. 1) using alignment pins (no shown). For example, prior to installing the circuit board component 24 on the circuit board 26, a user can insert alignment pins into non-plated tooling holes within the circuit board 26 that were placed there for use with a stencil (i.e., for stencil registration). The positions of the alignment holes 60 of the nozzle 22 are made to correspond to these tooling holes. Accordingly, the user can engage the circuit board component 24 within the nozzle 22 (e.g., fasten the component 24 within the nozzle 22 using a vacuum) and manually lower the nozzle 22 so that the alignment holes 60 of the nozzle 22 mate with the alignment pins. As a result, the circuit board component 24 can be positioned over the mounting location 40 with high precision for soldering the circuit board component 24 to the circuit board 26. This arrangement does not need the assistance of a workstation for precise positioning of the component 24. Further details of the invention will now be provided with reference to FIG. 3.

Figure 3:
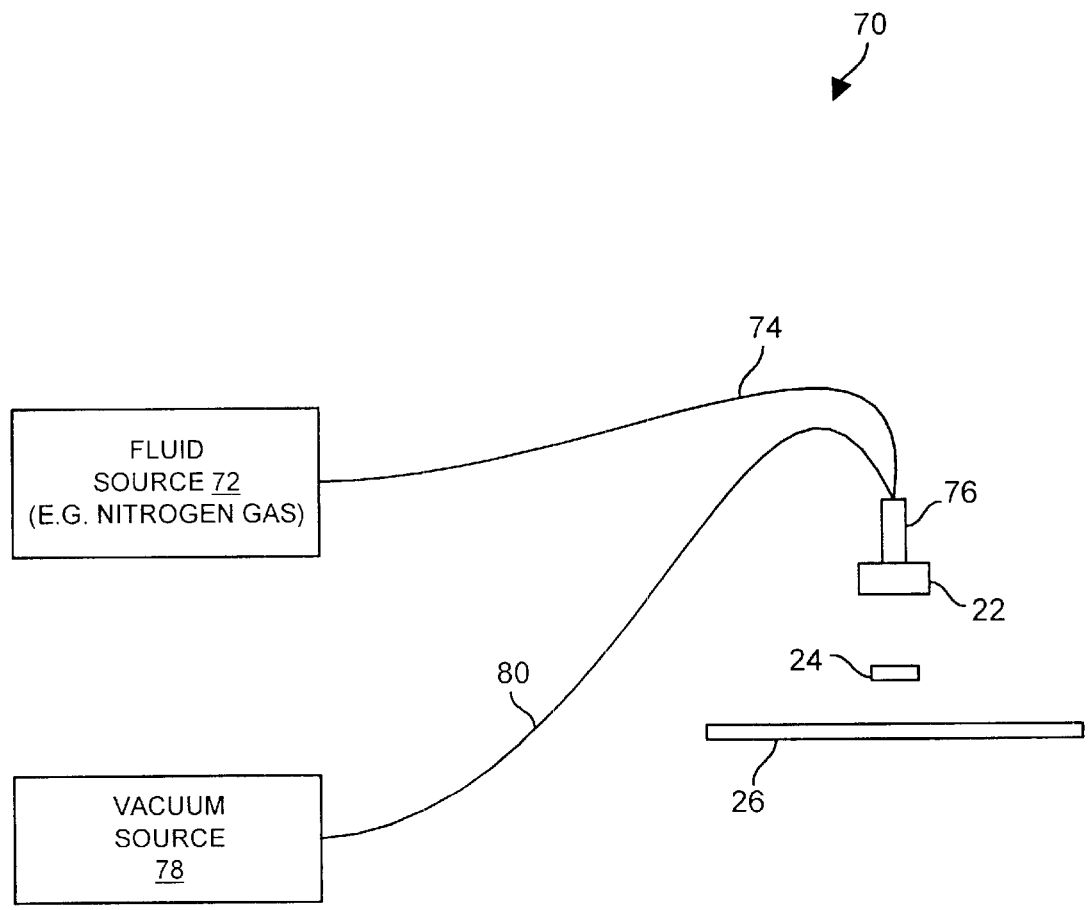
FIG. 3 is a perspective view of a circuit board modification system which uses the nozzle of FIG. 1.

FIG. 3 shows a circuit board modification system 70 which is suitable for use by the invention. The circuit board modification system 70 includes, among other things, the nozzle 22 of FIGS. 1 and 2 for removing an old circuit board component 24 from the circuit board 26 and/or installing a new circuit board component 24 onto the circuit board 26.

As shown in FIG. 3, the circuit board modification system 70 further includes a fluid source 72 (e.g., a source of nitrogen gas), a fluid hose 74, a heat gun 76, a vacuum source 78, and a vacuum hose 80. The fluid hose 74 conveys fluid from the fluid source 72 to the heat gun 76. Similarly, the vacuum hose 80 provides a vacuum from the vacuum source 78 to the heat gun 76. Further details of the invention will now be provided with reference to FIG. 4.

Figure 4:
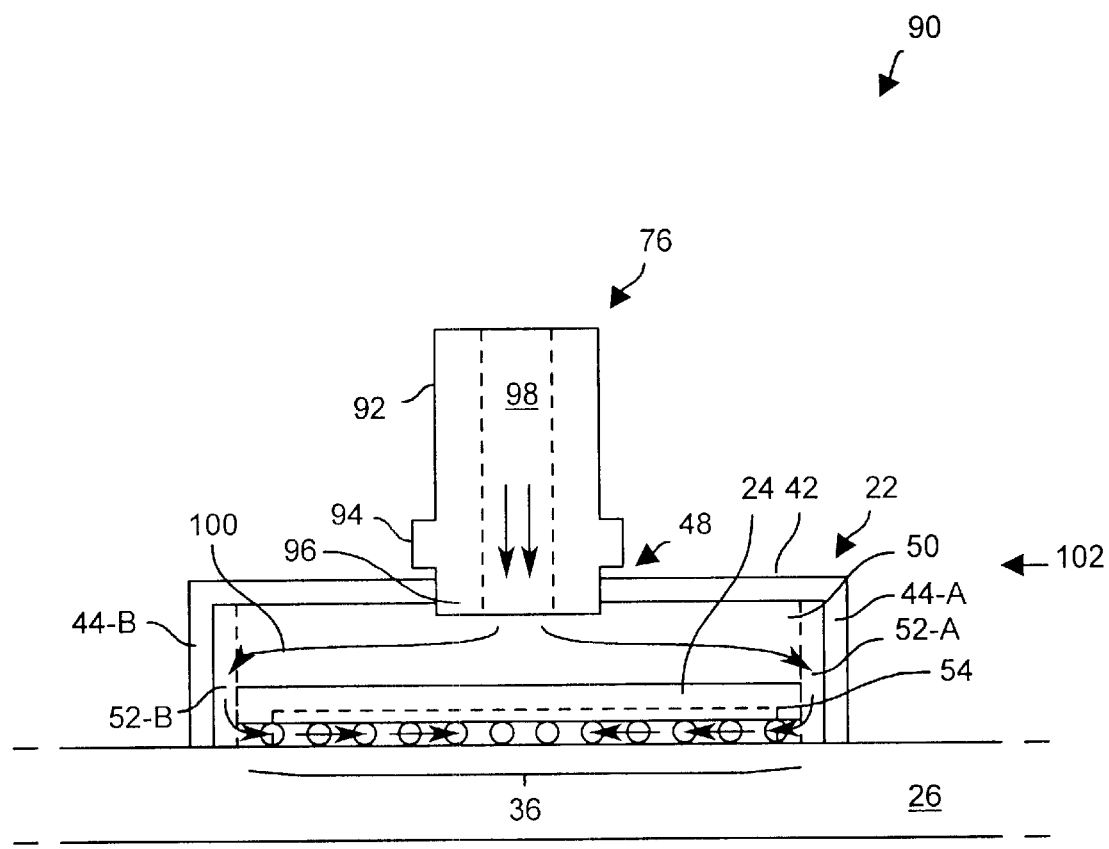
FIG. 4 is a cross-sectional front view of the nozzle of FIG. 1 when fluid is applied through the nozzle from a fluid source.

FIG. 4 shows a cross-sectional front view 90 of the nozzle 22 of FIG. 1 when the heat gun 76 attaches to the nozzle 22 and when the nozzle 22 engages the circuit board component 24 over the circuit board 26. As shown, the circuit board component 24 fits between the fluid-delivery side members 44. The surface of the fluid-delivery side member 44-A (also see FIG. 2) and a respective fluid-delivery edge of the component 24 (e.g., the fluid-delivery edge 30-A, also see FIG. 1) form the fluid-delivery channel 52-A. Similarly, the fluid-delivery side member 44-B (FIG. 2) and another respective fluid-delivery edge of the component 24 (e.g., the fluid-delivery edge 30-B, also see FIG. 1) form the fluid-delivery channel 52-B.

As further shown in FIG. 4, the heat gun 76 includes a housing 92 that defines an outer protrusion 94, a nozzle end 96, and a fluid channel 98. The nozzle end 96 inserts into the input channel 48 of the nozzle 22. In one arrangement, the outer protrusion 94 (e.g., a metallic ridge, a gasket, etc.) prevents fluid leakage between the heat gun 76 and the nozzle 22. When a user activates the heat gun 76, fluid 100 passes through the fluid channel 98 of the heat gun 76 and into the cavity 50 defined by the nozzle 22. The fluid 100 passes through the fluid-delivery channels 52 defined, in part, by the fluid-delivery side members 44 into the solder region 36 of the circuit board component 24. The fluid 100 escapes from the solder region 36 through the fluid-escape channels 54 defined by the fluid-escape side members 46.

It should be understood that, when the heat gun 76 delivers the fluid 100, the fluid path through the nozzle 22 is not blocked. Rather, the fluid 100 continues to flow from the cavity 50 located above the circuit board component 24 to the solder region 36 located below the circuit board component 24, and eventually out through the fluid-escape side channels 54. Since the fluid 100 simultaneously flows above and below the circuit board component 24, circuit board component 24 is generally brought to the same temperature throughout. Accordingly, use of the nozzle 22 avoids providing significant temperature stresses on the circuit board component 24, which are common in the earlier-described conventional approaches which unevenly heat components in a top down manner and which would otherwise raise reliability concerns.

It should be further understood that the heat gun 76 further includes a vacuum element (not shown in FIG. 4 for simplicity) that extends through the fluid channel 98 in order to apply a vacuum from the vacuum source 78 (see FIG. 3) to the circuit board component 24. When this occurs, the nozzle 22 holds the circuit board component 24 in place as solder in the solder region 36 melts. Accordingly, the component 24 can be precisely located over the mounting location 40 of the circuit board 26 by precisely positioning the nozzle 22 during component installation, and easily lifted from the mounting location 40 by moving the nozzle 22 away from the circuit board 26 during component removal. Further details of the invention will now be provided with reference to FIG. 5.

Figure 5:
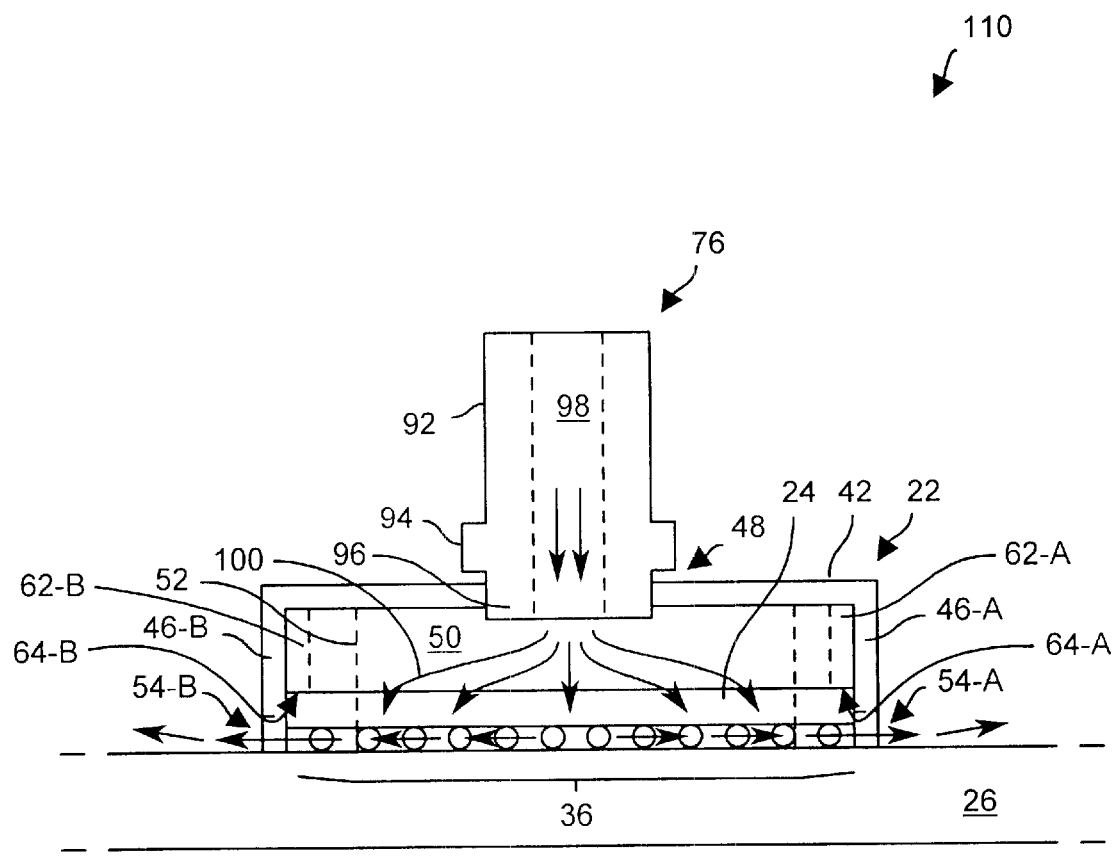
FIG. 5 is another cross-sectional side view of the nozzle of FIG. 1 when the fluid is applied through the nozzle from the fluid source.

FIG. 5 shows a cross-sectional side view 110 of the nozzle 22 of FIG. 1 when the nozzle 22 engages the circuit board component 24 over the circuit board 26. The view 110 is what would be seen from the perspective of the arrow 102 of FIG. 4. As shown in FIG. 5, the circuit board component 24 fits between the fluid-escape side members 46. The interference surfaces 64, which are defined by the interference portions 62 of the fluid-escape side members 46, contact the top surface of the circuit board component 24. The surface of the fluid-escape side member 46-A and the surface of the circuit board 26 define the fluid-escape channel 54-A. Similarly, the surface of the fluid escape side member 46-B and the surface of the circuit board 26 define the fluid-escape channel 54-B.

As further shown in FIG. 5, the fluid 100 entering the cavity 50 through the fluid channel 98 of the heat gun 76 passes through the fluid-delivery channels 52 defined, in part, by the fluid-delivery side members 44 (also see FIG. 2) and into the solder region 36. The fluid 100 escapes from the solder region 36 through the fluid-escape channels 54.

As mentioned above, it should be understood that the path through the nozzle 22 for the fluid 100 is not blocked. Rather, the fluid 100 circulates through the nozzle 22 (i.e. through the cavity 50 and the solder region 36, and out the fluid-escape channels 54) when the heat gun 76 delivers the fluid 100. Accordingly, both the top and the bottom of the circuit board component 24 are generally kept at the same temperature. As such, significant thermal stresses on the circuit board component 24 are minimized. Accordingly, distortion of the interconnects of the circuit board component 24 (e.g., the internal makings of the component 24) and the mounting location 40 of the circuit board 26 is minimal.

As further mentioned above, in one arrangement, the heat gun 76 includes a vacuum element (not shown in FIG. 5 for simplicity) that extends through the fluid channel 98 in order to provide a vacuum from the vacuum source 78 to the circuit board component 24. When this occurs, the nozzle 22 holds the circuit board component 24 in place as solder in the solder region 36 melts. Further details of the invention will now be provided with reference to FIG. 6.

Figure 6:
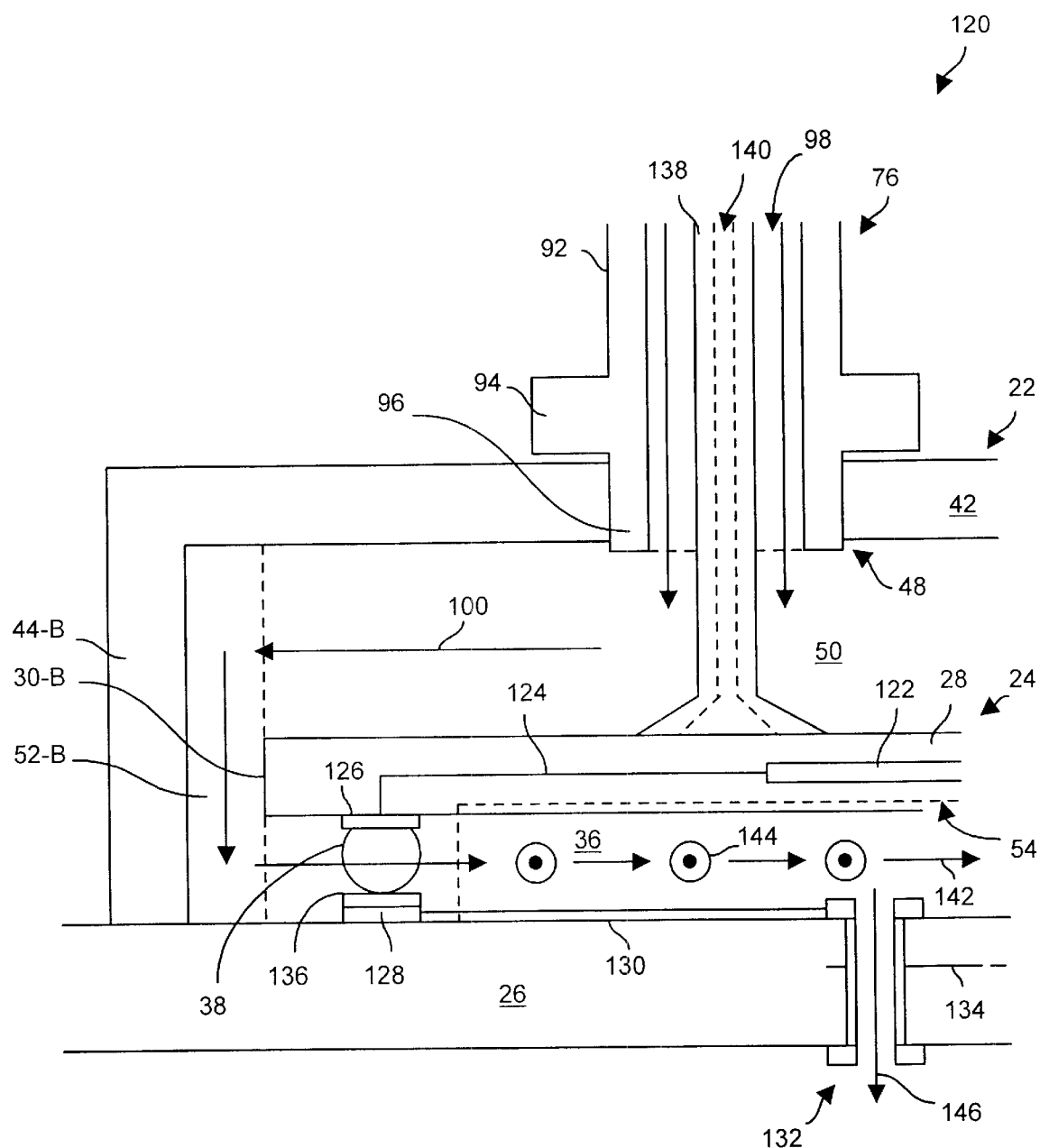
FIG. 6 is a close-up view of a portion of the cross-sectional front view of FIG. 4 showing particular fluid flow details.

FIG. 6 shows a close-up view 120 of a portion of the cross-sectional front view 90 of FIG. 4 showing particular details of various features of FIG. 4. For example, the circuit board component 24 includes electronic circuitry 122 (e.g., residing on a silicon chip), a component lead 124, a conductive pad 126 and a solder ball 38. The circuit board 26 includes a number of circuit board structures such as a conductive pad 128 which corresponds to conductive pad 126 of the circuit board component 24, external conductive etch 130, a circuit board via 132, and internal conductive etch 134. Solder 136 resides on the conductive pad 128 to solder the solder ball 38 of the circuit board component 24 to the conductive pad 128 in response to hot fluid applied by the nozzle 22 (e.g., heated nitrogen gas).

As further shown in FIG. 6, heat gun 76 includes a vacuum element 138 which defines a vacuum channel 140. During operation, the vacuum source 78 (see FIG. 3) provides a vacuum through the vacuum channel 140 enabling the circuit board component 24 to be firmly held in place (e.g., for installation or removal of the circuit board component 24) relative to the nozzle 22 by way of the heat gun 76.

It should be understood that a number of interconnections exists between the electronic circuitry 122 and the internal conductive etch 134, all of which are susceptible to stress due to temperature changes. In particular, interconnects exist between (i) the electronic circuitry 122 and the lead 124, (ii) the lead 124 and the conductive pad 126, (iii) the conductive pad 126 and the solder ball 38, (iv) the solder ball 38 and the conductive pad 128, (v) the conductive pad 128 and the external etch 130, (vi) the external etch 130 and the circuit board via 132, and (vii) the circuit board via 132 and the internal conductive etch 134. All of these interconnects are reliability concerns if subjected to uneven substantial thermal stress as is typical of heating components in a conventional top down manner. However, use of the nozzle 22 provides evenly distributed heating thus minimizing thermal stresses on the above-described interconnects.

When the heat gun 76 provides the fluid 100 through the fluid channel 98, the fluid 100 passes through the cavity 50 (i.e., a plenum defined by the top member 42, side members 40, 46 and the circuit board component 24) to the solder region 36 through the fluid-delivery channels 52 (e.g., the fluid-delivery channel 52-B of FIG. 6). The fluid 100 in the solder region 36 circulates among the solder ball 38 as illustrated by the arrow 142. Most of the fluid 100 escapes from the solder region 36 through the fluid-escape channels 54 defined, at least in part, by the fluid-escape side members 46 (also see FIGS. 1, 2, 4 and 5) as illustrated by the arrow 144 (arrowheads 144 pointing up and out of the page). Some of the fluid 100 escapes from the solder region 36 through the via 132 as illustrated by the arrow 146 thus heating the via 132 to more evenly distribute heat and reduce the opportunity for uneven thermal differences. Preferably, the vias of the circuit board 26 operate as heat pipes to carry away any undesirable extreme temperatures.

It should be understood that the size of the fluid-escape channels 54 is defined by the fluid-escape side members 46. It should be further understood that the amount of gas flowing through the vias beneath the nozzle 22 (e.g., see the via 132 of FIG. 6) is controlled by the size of the fluid-escape channels 54. That is, adjusting the size of the fluid-escape channels 54 controls the amount of gas that flows through the vias. In particular, increasing the size of the fluid-escape channels 54 decreases the amount of gas flowing through the vias since more gas is allowed to escape through the fluid-escape channels 54. Conversely, decreasing the size of the fluid-escape channels 54 increases the amount of gas flowing through the vias since less gas is allowed to escape through the fluid-escape channels 54 thus forcing more air through the vias. Since the vias preferably connect to copper within the circuit board 26 and since copper is a good heat conductor, heating of the circuit board 26 can be improved by reducing the size of the fluid-escaped channels 54 defined by the fluid-escape members 46 to force more heated gas through the vias.

As mentioned above, the nozzle 22 and the circuit board manufacturing system 70 is equally suitable for soldering a component to a circuit board, or unsoldering a component from a circuit board. Further details of the invention will now be provided with reference to FIG. 7 which describes how a user solders a component to a circuit board using the system 70, and FIG. 8 which describes how a user unsolders a component from a circuit board using the system 70.

Figure 7:
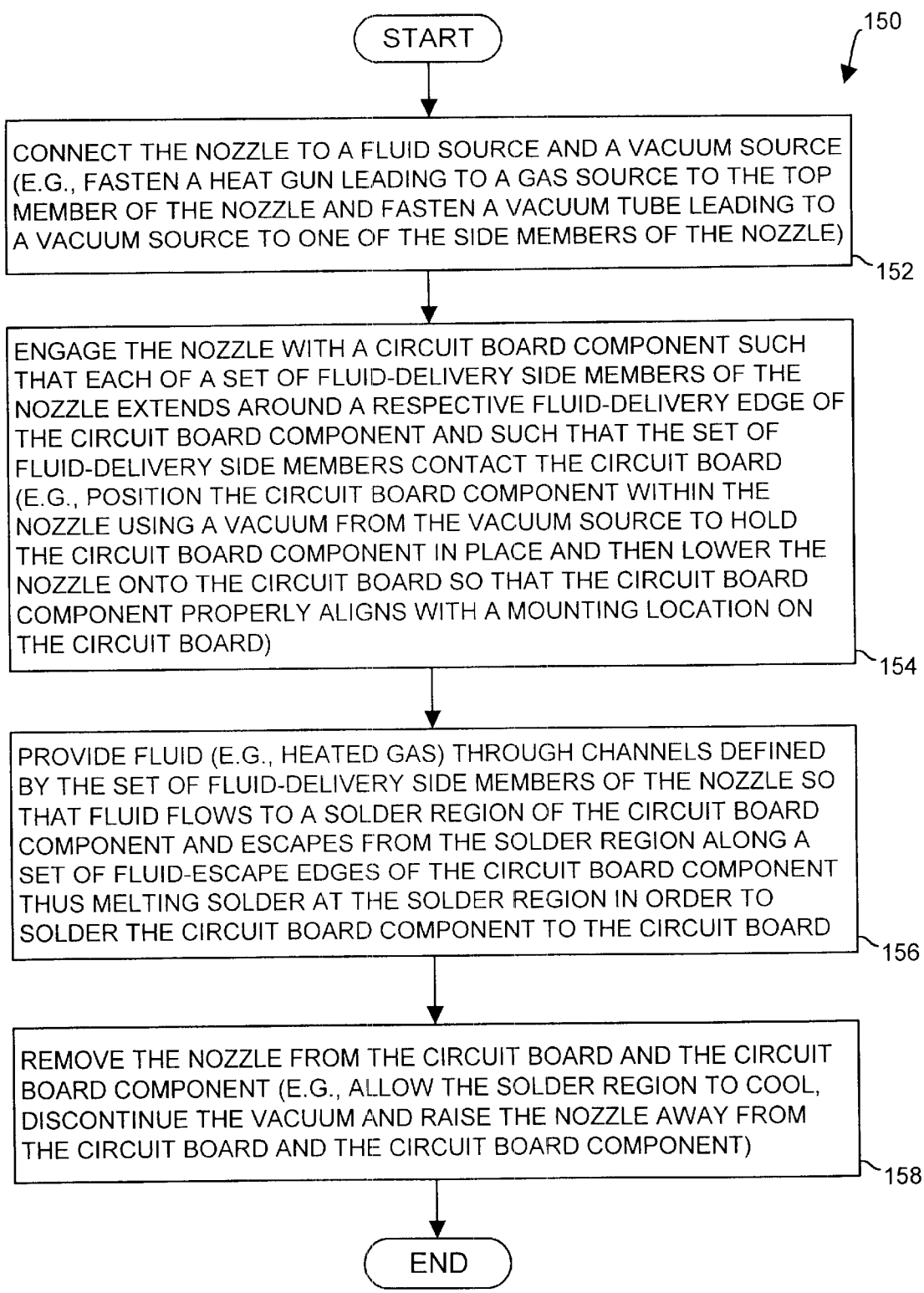
FIG. 7 is a flow chart of a procedure performed by a user when using the nozzle to solder a circuit board component to a circuit board.

FIG. 7 shows a flowchart of a procedure 150 which is performed by a user when using the nozzle 22 to solder the circuit board component 24 to the circuit board 26 (also see FIG. 3). In step 152, the user connects the nozzle 22 to the fluid source 72 and the vacuum source 78. In particular, the user fastens the heat gun 76 which is connected to both the fluid source 72 through the fluid hose 74 and the vacuum source 78 through the vacuum hose 80, to the nozzle 22.

In step 154, the user engages the nozzle 22 with the circuit board component 24 such that each of the set of fluid-delivery side members 44 of the nozzle 22 extends around a respective fluid-delivery edge 30 of the circuit board component 24 (see FIG. 1), and such that the set of fluid-delivery side members 44 contact the circuit board 26. In particular, the user positions the circuit board component 24 within the nozzle 22 using a vacuum from the vacuum source 78 to hold the circuit board component 24 in place. The user then lowers the nozzle 22 onto the circuit board 26 so that the circuit board component 24 properly aligns with the mounting location 40 of the circuit board 26.

In step 156, the user provides fluid (e.g., heated gas) through input channel 48 (see FIGS. 1 and 2) and through the fluid-delivery channels 52 defined by the set of fluid-delivery side members 44 so that the fluid flows into the solder region 36 of the circuit board component 24 and escapes from the solder region 36 along a set of fluid-escape edges 32 of the circuit board component 24. The fluid melts solder in the solder region 36 in order to solder the circuit board component 24 to the circuit board 26. In one arrangement, the user activates a timer to determine the length of time in which to provide the fluid.

In step 158, the user removes the nozzle 22 from the circuit board 26 in the circuit board component 24. In particular, the user stops applying the fluid thus allowing the solder region 36 to cool. At this point, strong, robust solder joints are formed between the component 24 and the mounting location 40 of the circuit board 26. Next, the user discontinues applying the vacuum from the vacuum source 78 and raises the nozzle 22 away from the circuit board 26 and the circuit board component 24. Accordingly, the user has successfully soldered the component 24 to the circuit board 26. The total amount of time required for such installation using the procedure 150 is approximately two minutes due to the ability of the nozzle 22 to channel the fluid directly to the solder region 36 between the component 24 and the circuit board 26. This installation time is substantially less than that for conventional approaches (e.g., more than 20 minutes). Further details and the invention will now be provided with reference to FIG. 8.

Figure 8:
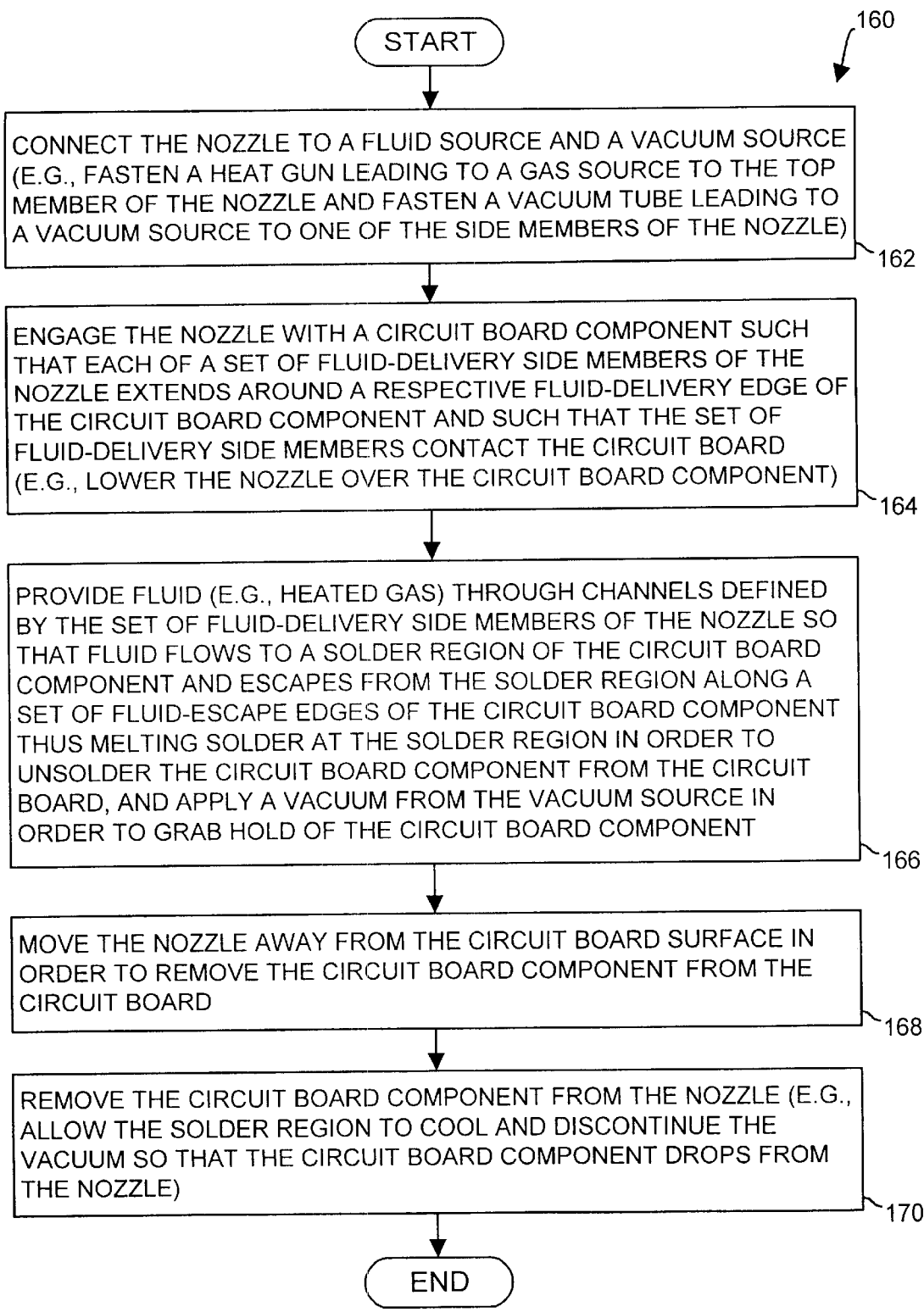
FIG. 8 is a flow chart of a procedure performed by a user when using the nozzle to unsolder a circuit board component from a circuit board.

FIG. 8 is a flowchart of a procedure 160 which is performed by a user when using the nozzle 22 to unsolder the circuit board component 24 from the circuit board 26. In step 162, the user connects the nozzle 22 to the fluid source 72 to the vacuum source 78. In particular, the user fastens the heat gun 76, which leads back to both the fluid source 72 and the vacuum source 78, to the nozzle 22.

In step 164, the user engages the nozzle 22 with the circuit board component 24 such that each of a set of fluid-delivery side members 44 of the nozzle 22 extends around a respective fluid-delivery edge 30 of the circuit board component 24, and such that the set of fluid-delivery side members 44 contact the circuit board 26. In particular, the user lowers the nozzle 22 over the circuit board component 24 which is soldered to the mounting location 40 of the circuit board 26.

In step 166, the user provides fluid 100 through the fluid-delivery channels 52 defined by the set of fluid-delivery side members 44 of the nozzle 22 so that the fluid flows to the soldering region 36 of the circuit board component 24 and escapes from the soldering region 36 along a set of fluid-escape edges 32 of the circuit board component 24 and through the fluid-escape channels 54. Additionally, the user provides a vacuum from the vacuum source 78 (also see FIG. 3) in order to attract the circuit board component 24. Accordingly, solder at the solder region 36 melts in response to the heat of the fluid 100, and the vacuum provided by the nozzle 22 grabs hold of the circuit board component 24. In one arrangement, the user activates a timer to determine the length of time in which to provide the fluid.

In step 168, the user moves the nozzle 22 away from the surface of the circuit board 26 in order to remove the circuit board component 24 from the circuit board 26. The vacuum provided by the vacuum source 78 holds the circuit board component 24 within the nozzle 22.

In step 170, the user removes the circuit board component 24 from the nozzle 22. In particular, the user allows the solder region 36 of the circuit board component 24 to cool, and discontinues the vacuum so that the circuit board component 24 drops from the nozzle 22. Accordingly, the user has successfully removed the component 24 from the circuit board 26. The total amount of time required to remove the component using the procedure 160 is approximately two minutes due to the ability of the nozzle 22 to channel the fluid directly to the solder region 36 between the component 24 and the circuit board 26. This time is substantially less than that for conventional approaches (e.g., more than 20 minutes for conventional approaches). Accordingly, with the procedure 160, the circuit board 26 is not heated long enough for thermal stress on the fiberglass to be an issue. Further details of the invention will now be provided with reference to FIG. 9.

Figure 9:
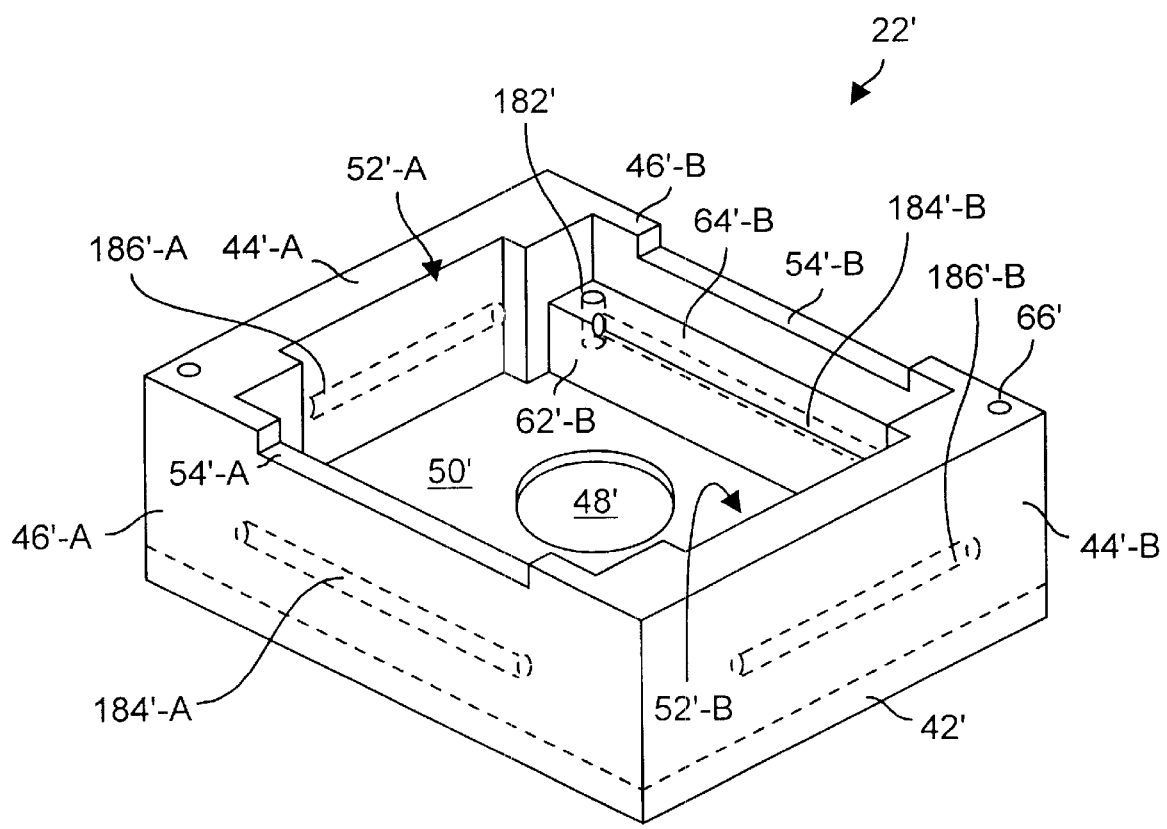
FIG. 9 is a perspective view of an alternative nozzle to that of FIG. 2 showing particular details of an underside of the alternative nozzle.

FIG. 9 shows a perspective view 180' of an alternative nozzle 22' which is suitable for use by the invention. The perspective view 180' is similar to the view 60 of FIG. 2 of the nozzle 22. As shown in FIG. 9, the alternative nozzle 22' includes many similar features to that of the nozzle 22. However, in contrast to the nozzle 22 of FIG. 2, portions of the alternative nozzle 22' of FIG. 9 define a network of vacuum channels which alleviate the need for the heat gun 76 to include a vacuum element for holding circuit board component 24. Only portions of the vacuum channel network are shown in FIG. 9 for simplicity. As shown in FIG. 9, each fluid-delivery side member 46' of the alternative nozzle 22' includes an interference portion 64' that defines a set of vacuum holes 182' (e.g., one vacuum hole 182' at each end of that interference portion 64') and a vacuum channel 184'. Similarly, each fluid-escape side member 44' of the alternative nozzle 22' defines a vacuum channel 186' which connects to both vacuum channels 184'. This network of vacuum holes 182' and vacuum channels 184', 186' can be formed within the side members 44', 46' by simply drilling precision holes which align with each other into the side members 44', 46', and filling the ends of the holes of the vacuum channels 184', 186'. Preferably, one of the ends of a vacuum channel 184', 186' is left unplugged so that a user can attach the vacuum hose 80 (see FIG. 3) to the vacuum channel network such that the component 24 can be grabbed by a vacuum through the vacuum holes 182' of the nozzle 22'. Accordingly, the nozzle 22' alleviates the need for the heat gun 76 to include a vacuum element for holding the circuit board component 24.

As described above, the invention is directed to techniques for modifying a circuit board 26 (e.g., removing and/or installing a circuit board component) using a nozzle 22 that is capable of providing fluid 100 (e.g., heated gas) between a circuit board component 24 and the circuit board 26. As such, heat can be applied in a more uniformly distributed manner (e.g., simultaneously above and underneath the component 24) relative to the above-described conventional top down manner. Accordingly, for a component 24 having a soldering region 36 between the component 24 and the circuit board 26 (e.g., a BGA component), there is less thermal stress placed on the component 24 and the circuit board mounting location 40 due to more uniform distribution of the fluid above and below the component 24. As such, the invention provides less reliability concern than the conventional top down heating approach, e.g., with the invention there is less package distortion, minimal stresses on the interconnects, etc.

Additionally, the temperature of the soldering region 36 rises more quickly due to direct delivery of fluid to the soldering region 36 thus shortening the time required to remove an old component and install a new one. Accordingly, the invention provides less reliability concern than the conventional top down heating approach, e.g., with the invention there is there is better preservation of the circuit board laminate, less thermal stressing of circuit board interconnects, less micro cracking of circuit board vias, etc.

The features of the invention, as described above, may be employed in circuit board manufacturing systems, devices and procedures such as those of EMC Corporation of Hopkinton, Mass.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the circuit board modification system 70 of FIG. 3 was described as including a heat gun 76 which directly attaches to the nozzle 22, by way of example only. The heat gun 76 preferably heated fluid from the fluid source 72 (e.g. nitrogen gas) to a higher temperature (e.g., which is suitable for melting solder) in order to either install for remove the circuit board component 24. For instance, the solder can be eutectic solder and have a melting temperature of 183 degrees Celsius, and the heated fluid can have a temperature of 220 degrees Celsius. In an alternative arrangement, the nozzle 22 attaches directly to a fluid hose which conveys fluid (e.g., nitrogen gas) which was preheated to the higher temperature.

Additionally, it should be understood that the fluid-delivery channels 52 were described as being defined, only in part, by the fluid-delivery side members 44. The fluid-delivery edges 30 of the circuit board component 28 defined the remaining parts of the fluid-delivery side channels 52. In an alternative arrangement, the fluid-delivery side members 44 exclusively define the fluid-delivery channels 52 in a manifold-like manner (e.g., complete holes through the side member material).

Furthermore, should be understood that the fluid-escape channels 54 were described as being defined, only in part, by the fluid-escape side members 46. The surface of the circuit board 26 defined the remaining parts of the fluid-escape channels 54. In an alternative arrangement, to fluid-escape side members 46 exclusively defined the fluid-escape channels fifty-four in a manifold-like manner.

Additionally, it should be understood that the above-described techniques of the invention were applied to a BGA component by way of example only. Other types of components and mounting technologies are suitable as well. For example, the component 24 can be ceramic, metal, plastic, Glob Top, etc. Moreover, the techniques of the invention can be applied to BGAs, Chip Scale Packaging (CSP) technologies (e.g., flip-chip technologies, chip-on-board technologies, COBs, etc.), and the like.

Furthermore, it should be understood that a user can employ the techniques of the invention for various of reasons. For example, the techniques are suitable for purging components from a particular batch of circuit boards, i.e., removing/replacing components which were installed on the circuit boards but subsequently deemed or determined to be out-of-spec, faulty or an incorrect part. Other reasons for removing/replacing components using the invention include circuit board repair, upgrades, and rectification of field returns (e.g., to undue a particular circuit board customization made for a particular field location so that the circuit board can be reused elsewhere). Such modifications and enhancements are intended to be considered parts of various arrangements of the invention.

What is claimed is:

1. A nozzle for applying fluid to a solder region of a circuit board component, the circuit board component having a set of fluid-delivery edges and a set of fluid-escape edges, the nozzle comprising:
   a top member to connect with a fluid source; and
   a set of fluid-delivery side members coupled to the top member, wherein each fluid-delivery side member extends from the top member and around a respective fluid-delivery edge of the circuit board component when the circuit board component engages with the nozzle, and wherein each fluid-delivery side member defines:
   (i) at least a portion of a fluid-delivery channel that extends from a vicinity adjacent the top member toward the solder region of the circuit board component when the circuit board component engages with the nozzle, and
   (ii) a barrier that substantially prevents fluid from escaping from the solder region of the circuit board component along the respective fluid-delivery edge for that fluid-delivery side member so that fluid escapes from the solder region of the circuit board component along the set of fluid-escape edges of the circuit board component when the circuit board component engages with the nozzle and when the set of fluid-delivery side members contacts a circuit board.

2. The nozzle of claim 1, further comprising:
   a set of fluid-escape side members coupled to the top member, wherein each fluid-escape side member extends from the top member and around a respective fluid-escape edge of the circuit board component when the circuit board component engages with the nozzle, and wherein each fluid-escape side member defines at least a portion of a fluid-escape channel to enable gas to escape from the solder region of the circuit board component when the circuit board component engages with the nozzle and when the set of fluid-delivery side members contact the circuit board.

3. The nozzle of claim 2 wherein the set of fluid-escape side members couple to the set of fluid-delivery side members such that the top member, the set of fluid-delivery side members and the set of fluid-escape side members form a cavity over a side of the circuit board component that is opposite the solder region when the circuit board component engages with the nozzle.

4. The nozzle of claim 2 wherein the set of fluid-delivery side members includes exactly two fluid-delivery side members, and wherein the set of fluid-escape side members includes exactly two fluid-escape side members.

5. The nozzle of claim 4 wherein the two fluid-delivery side members and the two fluid-escape side members form a rectangle, wherein the two fluid-delivery side members are disposed on opposite sides of the rectangle, and wherein the two fluid-escape side members are disposed on other opposite sides of the rectangle.

6. The nozzle of claim 2 wherein each fluid-escape side member includes an interference portion which defines an interference surface that prevents the circuit board component from contacting the top member when the circuit board component engages with the nozzle.

7. The nozzle of claim 6 wherein the interference portion of each fluid-escape side member further defines at least one vacuum channel through the interference surface to hold the circuit board component in response to a vacuum from a vacuum source.

8. A circuit board modification system, comprising:
   a fluid source to provide fluid; and
   a nozzle to apply fluid from the fluid source to a solder region of a circuit board component, the circuit board component having a set of fluid-delivery edges and a set of fluid-escape edges, the nozzle including:
   a top member that connects with the fluid source, and
   a set of fluid-delivery side members coupled to the top member, wherein each fluid-delivery side member extends from the top member and around a respective fluid-delivery edge of the circuit board component when the circuit board component engages with the nozzle, and wherein each fluid-delivery side member defines (i) at least a portion of a fluid-delivery channel that extends from a vicinity adjacent the top member toward the solder region of the circuit board component when the circuit board component engages with the nozzle, and (ii) a barrier that substantially prevents fluid from escaping from the solder region of the circuit board component along the respective fluid-delivery edge for that fluid-delivery side member so that fluid escapes from the solder region of the circuit board component along the set of fluid-escape edges of the circuit board component when the circuit board component engages with the nozzle and when the set of fluid-delivery side members contacts a circuit board.

9. The system of claim 8 wherein the nozzle further includes:
   a set of fluid-escape side members coupled to the top member, wherein each fluid-escape side member extends from the top member and around a respective fluid-escape edge of the circuit board component when the circuit board component engages with the nozzle, and wherein each fluid-escape side member defines at least a portion of a fluid-escape channel to enable gas to escape from the solder region of the circuit board component when the circuit board component engages with the nozzle and when the set of fluid-delivery side members contact the circuit board.

10. The system of claim 9 wherein the set of fluid-escape side members couple to the set of fluid-delivery side members such that the top member, the set of fluid-delivery side members and the set of fluid-escape side members form a cavity over a side of the circuit board component that is opposite the solder region when the circuit board component engages with the nozzle.

11. The system of claim 9 wherein the set of fluid-delivery side members of the nozzle includes exactly two fluid-delivery side members, and wherein the set of fluid-escape side members of the nozzle includes exactly two fluid-escape side members.

12. The system of claim 11 wherein the two fluid-delivery side members and the two fluid-escape side members form a rectangle, wherein the two fluid-delivery side members are disposed on opposite sides of the rectangle, and wherein the two fluid-escape side members are disposed on other opposite sides of the rectangle.

13. The system of claim 9 wherein each fluid-escape side member of the nozzle includes an interference portion which defines an interference surface that prevents the circuit board component from contacting the top member when the circuit board component engages with the nozzle.

14. The system of claim 13, further comprising:
   a vacuum source to provide a vacuum, wherein the interference portion of each fluid-escape side member (i) further defines at least one vacuum channel through the interference surface and (ii) connects with the vacuum source in order to hold the circuit board component in response to the vacuum from the vacuum source.

15. A method for applying fluid to a solder region of a circuit board component, the circuit board component having a set of fluid-delivery edges and a set of fluid-escape edges, the method comprising the steps of:
   connecting a top member of a nozzle with a fluid source;
   engaging the nozzle with the circuit board component such that each of a set of fluid-delivery side members of the nozzle, coupled to the top member, extends from the top member and around a respective fluid-delivery edge of the circuit board component, and such that the set of fluid-delivery side members contacts a circuit board, each fluid-delivery side member defining:
      (i) at least a portion of a fluid-delivery channel that extends from a vicinity adjacent the top member toward the solder region of the circuit board component, and
      (ii) a barrier that substantially prevents fluid from escaping from the solder region of the circuit board component along the respective fluid-delivery edge for that fluid-delivery side member; and
   providing fluid from the fluid source through the nozzle so that fluid escapes from the solder region of the circuit board component along the set of fluid-escape edges of the circuit board component.

16. The method of claim 15 wherein the step of engaging includes the step of:
   forming a cavity over a side of the circuit board component that is opposite the solder region, the cavity being defined by (i) the top member, (ii) the set of fluid-delivery side members and (iii) a set of fluid-escape side members coupled to the top member, wherein each fluid-escape side member extends from the top member and around a respective fluid-escape edge of the circuit board component when the circuit board component engages with the nozzle, and wherein each fluid-escape side member defines at least a portion of a fluid-escape channel to enable gas to escape from the solder region of the circuit board component.

17. The method of claim 16 wherein the step of forming the cavity includes the step of:
   placing the circuit board component in contact with an interference surface defined by an interference portion of each fluid-escape side member, the interference portion of each fluid-escape side member preventing the circuit board component from contacting the top member of the nozzle.

18. The method of claim 17 wherein the interference portion of each fluid-escape side member further defines at least one vacuum channel through the interference surface defined by the interference portion of that fluid-escape side member, and wherein the method further comprises the step of:
   connecting the nozzle to a vacuum source in order to hold the circuit board component in place relative to the nozzle.

19. A nozzle for applying fluid to a solder region of a circuit board component, the circuit board component having a set of fluid-delivery edges and a set of fluid-escape edges, the nozzle comprising:
   a top member to connect with a fluid source;
   means for providing the fluid from a vicinity adjacent the top member to the solder region of the circuit board component around the set of fluid-delivery edges of the circuit board component; and
   a set of fluid-escape side members coupled to the top member, wherein each fluid-escape side member extends from the top member and around a respective fluid-escape edge of the circuit board component when the circuit board component engages with the nozzle, and wherein each fluid-escape side member defines at least a portion of a fluid-escape channel to enable gas to escape from the solder region of the circuit board component when the circuit board component engages with the nozzle.

20. A circuit board modification system, comprising:
   a fluid source to provide fluid; and
   a nozzle to apply fluid from the fluid source to a solder region of a circuit board component, the circuit board component having a set of fluid-delivery edges and a set of fluid-escape edges, the nozzle including:
      a top member that connects with the fluid source,
      means for providing the fluid from a vicinity adjacent the top member to the solder region of the circuit board component around the set of fluid-delivery edges of the circuit board component; and
      a set of fluid-escape side members coupled to the top member, wherein each fluid-escape side member extends from the top member and around a respective fluid-escape edge of the circuit board component when the circuit board component engages with the nozzle, and wherein each fluid-escape side member defines at least a portion of a fluid-escape channel to enable gas to escape from the solder region of the circuit board component when the circuit board component engages with the nozzle.

* * * * *